United States Patent [19]

Fuchs

[11] Patent Number: 4,768,194
[45] Date of Patent: Aug. 30, 1988

[54] INTEGRATED SEMICONDUCTOR MEMORY

[75] Inventor: Hans P. Fuchs, Munich, Fed. Rep. of Germany

[73] Assignee: Siemens Aktiengesellschaft, Berlin and Munich, Fed. Rep. of Germany

[21] Appl. No.: 906,454

[22] Filed: Sep. 11, 1986

[30] Foreign Application Priority Data

Sep. 11, 1985 [DE] Fed. Rep. of Germany ....... 3532443

[51] Int. Cl.$^4$ ............................................ G06F 11/10
[52] U.S. Cl. ...................................... 371/21; 365/201
[58] Field of Search .................... 371/21, 25; 365/200, 365/201

[56] References Cited

U.S. PATENT DOCUMENTS

| | | | |
|---|---|---|---|
| 4,458,338 | 7/1984 | Giebel et al. | 365/201 |
| 4,625,162 | 11/1986 | Bosnyak | 371/21 |
| 4,625,311 | 11/1986 | Fitzpatrick | 371/21 |
| 4,654,827 | 3/1987 | Childers | 371/21 |
| 4,686,456 | 8/1987 | Furuyama | 371/21 |
| 4,692,923 | 9/1987 | Poeppelman | 371/21 |

OTHER PUBLICATIONS

IEEE International Solid-State Circuit Conference, 1981, pp. 84 to 85.
Elektronik, No. 15, Jul. 30, 1982, pp. 27 to 30.
Patents Abstract of Japan, vol. 6, (P-111)[940], Apr. 21, 1982.

Primary Examiner—Michael R. Fleming
Attorney, Agent, or Firm—Herbert L. Lerner; Laurence A. Greenberg

[57] ABSTRACT

An integrated semiconductor memory includes n identical memory cell fields, n.m data lines for writing memory data into and reading memory data out of the fields, m data input terminals receiving the memory data to be written into the semiconductor memory during writing, m first data switches for applying the memory data to a respective one of the n data lines as a function of addressing data, m second data switches each selecting a respective one of the n data lines when reading out the memory data applied to the n data lines as a function of the addressing data, an evaluation circuit connected to n of the n.m data lines in parallel to the second data switches issuing an output signal containing the memory data read out from the fields if none of the memory data are defective and having a high-resistance state if between 1 and n-1 memory data are defective, a third data switch transferring the memory data in parallel to all of the n data lines as a function of a control signal from a terminal, and m fourth data switches receiving the control signal and another control signal complementary thereto for feeding the memory data selected by the second data switch or the output signal from the evaluation circuit to a data output terminal, the data output terminal having a high-resistance state when the output signal from the evaluation circuit has a high-resistance state.

14 Claims, 8 Drawing Sheets

FIG 7
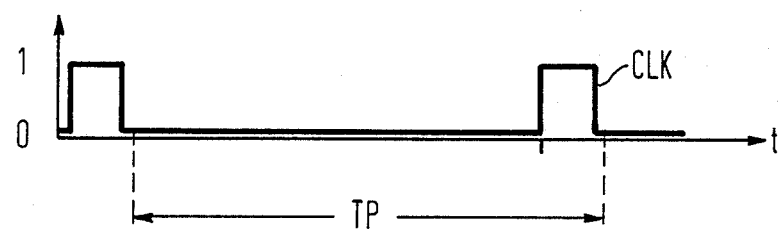
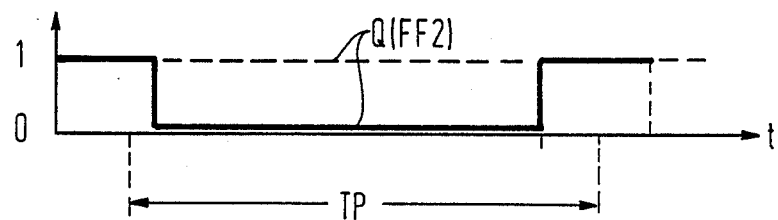

INTEGRATED SEMICONDUCTOR MEMORY

BACKGROUND OF THE INVENTION

The invention relates to an integrated semiconductor memory, including n identical memory cell fields, n.m data lines for writing memory data into and reading memory data out of the memory cell fields, m first data switches each applying memory data (which is to be written into the semiconductor memory and which are present during writing at one of m data input terminals assigned to the first data switches) to one of the n data lines belonging to the first data switches, m second data switches each selecting one of the n data lines when reading out memory data applied to the n data lines, in dependence on the addressing data, and m data output terminals receiving the memory data from outputs of the second data switches.

PRIOR ART

Semiconductor memories of the above-mentioned type are known, for instance, from the IEEE International Solid-State Circuits Comference 1981, pages 84 to 85, and from the publication Elektronik, No. 15, July 30, 1982, pages 27 to 30. In connection with semiconductor memories of this type, it is known to divide the entire memory area (which has a data interface for data input and output that is one bit wide as far as the user is concerned) into n identical cell fields. For this purpose, it is customary to assign a data line of its own which is internal to the memory to each cell field, all of which are connected through a first data filter to a data input terminal. During operation, a selection is made as to which of the n data lines are to be connected through to the data input terminal through one or a corresponding number of most-significant address input or inputs. Analogously, the n data lines are connected to a data output terminal through a second data switch.

The value of n is even-numbered. It is furthermore equal to the number of desired cell fields and depends on whether simple addressing signals, i.e., only so-called X addresses or Y addresses are applied to address inputs through which the semiconductor memory is addressed, as is well known, or address signals are applied which successively contain an X address as well as a Y address (address multiplexing) within a clock period of the semiconductors memory. In this case, n can only be a number divisible by 4.

Semiconductor memories are also known which have data interfaces more than 1 bit wide for data input and output. Typical forms of organization for this purpose are data interfaces with a width of m=4, 8 and 9 bits. Several semiconductor memories constructed in this manner contain more and more storage cells due to the progressing integration possibilities. However, the increase in memory cells per semiconductor memory causes increased costs in time, personnel and financing for testing semiconductor memories during the manufacture thereof as well as at the customer who as a rule carries out a so-called "incoming inspection". Because of the special required configuration of test patterns for the tests, the time required for the testing increases exponentially with the increase in storage cells. For this reason, it is desirable to be able to shorten the testing time distinctly without diminishing the efficiency of the test patterns being used. Previous tests with integrated circuits, in which several semiconductor chips or modules were tested in parallel by an automatic tester did furnish an excellent shortening of the test time, but the mechanical effort required therefor (test prods in the wafer plane, measuring sockets with cables in the module plane) was very large. In addition, existing test programs had to be adapted in a complicated manner.

It is accordingly an object of the invention to provide an integrated semiconductor memory which overcomes the hereinafore-mentioned disadvantages of the heretofore-known devices of this general type and which makes it possible to shorten the testing time distinctly without a loss of efficiency of the test patterns used.

SUMMARY OF THE INVENTION

With the foregoing and other objects in view there is provided, in accordance with the invention, an integrated semiconductor memory, comprising n identical memory cell fields, n.m data lines each being connected to a respective one of the memory cell fields for writing memory data into and reading memory data out of the memory cell fields, m data input terminals receiving the memory data to be written into the semiconductor memory during writing, m first data switches receiving addressing data or address signals and being connected between the data lines and the data input terminals for applying the memory data to a respective one of the n data lines as a function of the addressing data, m second data switches receiving the addressing data and being connected to the data lines for each selecting a respective one of the n data lines when reading out the memory data applied to the n data lines as a function of the addressing data and feeding the memory data from a selected data line to outputs thereof, an evaluation circuit or evaluation circuits connected to n of the n.m data lines in parallel to the second data switches, the evaluation circuit having an output issuing an output signal containing the memory data read out from the memory cell fields if none of the memory data are defective and having a high-resistance state if between 1 and n-1 memory data are defective, a terminal for providing a first control signal and a second control signal complementary to the first control signal, a third data switch connected between each of the m data input terminals and the n of n.m data lines parallel to the first data switches, for receiving the first control signal from the terminal and transferring the memory data in parallel to all of the n data lines as a function of the first control signal, m data output terminals, and m fourth data switches receiving the first and second control signals from the terminal and being connected between the outputs of the second data switches and evaluation circuit and the data output terminals, for selectively feeding the memory data selected by the second data switch and the output signal from the evaluation circuit to the data output terminal, the data output terminal having a high-resistance state when the output signal from the evaluation circuit has a high-resistance state.

The basic idea of the invention is to construct a semiconductor memory in such a way that on one hand, while it can be operated as usual in the normal case, on the other hand it is possible in the testing case to connect subareas of the semiconductor memory in parallel internal to the memory and to pick up read-out data as well as errors which have occurred by measurement at a memory terminal (pad or pin).

In accordance with another feature of the invention, the evaluation circuit or circuits, in order to feed through the read out of the memory cell field, includes a first multivibrator circuit with a first setting input being activated of all if the n data lines connected to the evaluation circuit have a first logical state (O.K. case), a second resetting input being activated if all of the n data lines connected to the evaluation circuit have a second logical state (O.K. case) complementary to the first logical state and an output being intentionally, selectively set or reset if all of the n data lines have the same (first or second) logical state, a setting circuit having an output, a second multivibrator circuit having an output, a first resetting input resetting the output of the second multivibrator circuit if all of the n data lines connected to the evaluation circuit do not have the same first or second logical state (fault case) and a second setting input connected to the output of the setting circuit for setting the output of the second multivibrator circuit.

In accordance with a further feature of the invention, the evaluation circuit or circuits includes a differentiation stage connected between the setting circuit and the terminal for activating the setting circuit when the first control signal is activated, when a supply voltage is applied through the differentiation stage and when a machine clock frequency is applied to the setting circuit.

In accordance with an added feature of the invention, the second input of the second multivibrator circuit sets the output thereof at the start of clock periods.

In accordance with an additional feature of the invention, the evaluation circuit or circuits includes a transistor having a source connected to the output of the first multivibrator circuit, a drain delivering the output signal of the evaluation circuit, and a gate connected to the output of the second multivibrator circuit.

In accordance with again another feature of the invention, each of the third data switches includes n transistors each having a conduction path connected between a corresponding one of the data input terminals and a respective one of the n data lines connected to the data input terminal, and gates connected in parallel to the terminal for receiving the first control signal.

In accordance with again a further feature of the invention, each of the m fourth data switches includes first and second transistors having source terminals connected together to the data output terminal connected to the fourth data switch, the first transistor having a drain terminal connected to the output of a corresponding one of the second data switches and a gate terminal connected to the first-mentioned terminal for receiving the second control signal, and the second transistor having a drain terminal connected to the output of the corresponding evaluation circuit and a gate terminal connected to the first-mentioned terminal for receiving the first control signal.

In accordance with again an added feature of the invention, the terminal includes a separate otherwise unused terminal portion of the semiconductor memory for the first control signal.

In accordance with again an additional feature of the invention, the terminal for the control signals is also used for other signals from the semiconductor memory.

In accordance with yet another feature of the invention, the addressing data or address signal includes a most significant addressing signal being fed to the terminal for the control signals during normal operation.

In accordance with yet a further feature of the invention, a higher potential than that corresponding to a logical "1" is applied for switching from normal to test operation in which the evaluation circuit or circuits is used.

In accordance with yet an added feature of the invention, including a discriminator circuit connected to the terminal for the control signals, for recognizing if a higher potential is applied.

With the objects of the invention in view there is also provided an integrated semiconductor memory, comprising n identical memory cell fields, n.m data lines each being connected to a respective one of the memory cell fields for writing memory data into and reading memory data out of the memory cell fields, m data input terminals receiving the memory data to be written into the semiconductor memory during writing, m first data switches receiving addressing data or address signals and being connected between the data lines and the data input terminals for applying the memory data to a respective one of the n data lines as a function of the addressing data, m second data switches receiving the addressing data and being connected to the data lines for each selecting a respective one of the n data lines when reading out the memory data applied to the n data lines as a function of the addressing data and feeding the memory data from a selected data line to outputs thereof, m data output terminals connected to the outputs of the second data switches, an evaluation circuit or evaluation circuits connected to n of the n.m data lines in parallel to the second data switches, the evaluation circuit having an output issuing an output signal containing the memory data read out from the memory cell fields if none of the memory data are defective and having a high-resistance state if between 1 and n-1 memory data are defective, another separate otherwise unused terminal connected to the output of the evaluation circuit, a terminal for providing a control signal, and a third data switch connected between each of the m data input terminals and the n of n.m data lines parallel to the first data switches, for receiving the control signal from the terminal and transferring the memory data in parallel to all of the n data lines as a function of the control signal.

In accordance with a concomitant feature of the invention, the evaluation circuit includes a first AND gate with n inputs and one output, a second AND gate with n inverted inputs and one output, an OR gate having two inputs each being connected to a respective one of the outputs of the AND gates and having an output, and a transistor having a source terminal connected to the output of the first AND gate, a gate terminal connected to the output of the OR gate, and a drain terminal delivering the output signal of the evaluation circuit.

The invention can be applied, among other things, to DRAMs and SRAMs as well as to EPROMs and EEPROMs.

Other features which are considered as characteristic for the invention are set forth in the appended claims.

Although the invention is illustrated and described herein as embodied in an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when

BRIEF DESCRIPTION OF THE DRAWING

FIG. 2 is a circuit diagram of a specific embodiment of an evaluation circuit AS;

FIG. 7 is an illustration of two timing diagram; and

FIG. 8 is a circuit diagram of another advantageous embodiment of an evaluation circuit AS.

DESCRIPTION OF THE PREFERRED EMBODIMENTS

Figure 1:
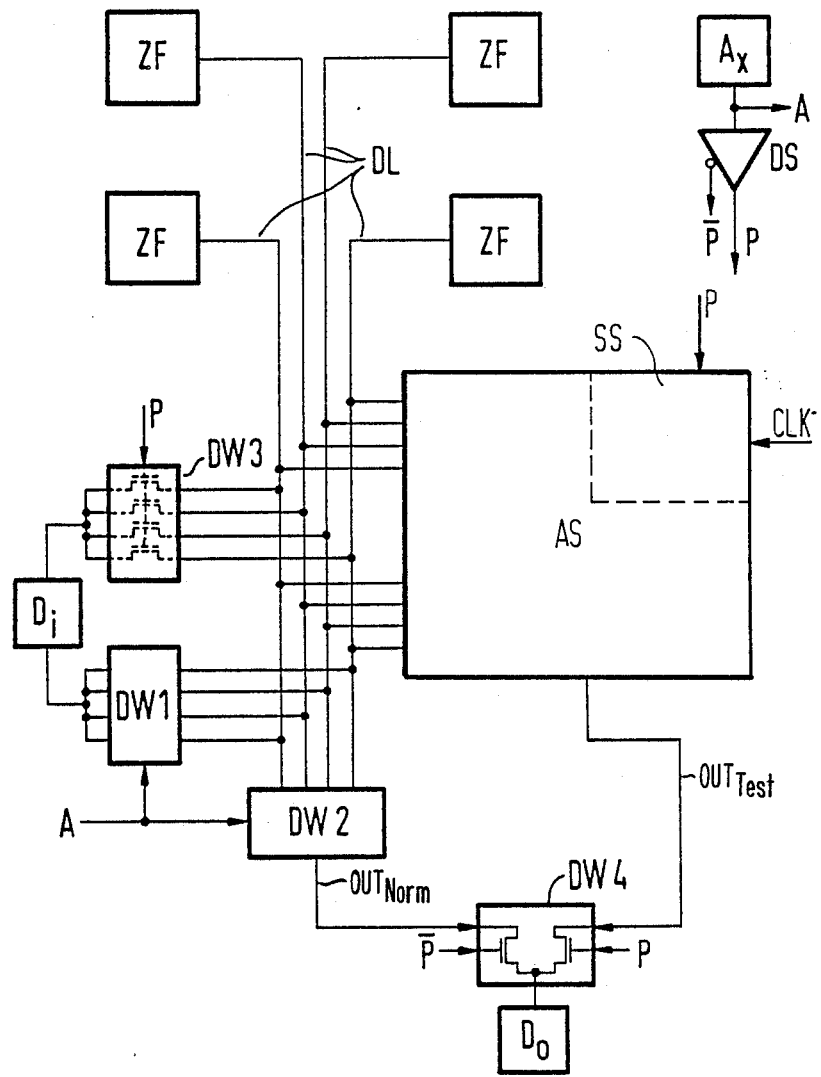
FIG. 1 is a schematic circuit diagram of a first embodiment of the invention.

Referring now to the figures of the drawings in detail and first, particularly, to FIG. 1 thereof, there is seen a semiconductor memory according to the invention with $m=1$ data input terminal $D_i$ and $m=1$ data output terminal $D_o$ of $n=4$ identical cell fields ZF (for instance, in a "megabit" memory: the total number of memory cells: 1024 k.1 bit = 1 M.1 bit for $n=4$ this results in four cell fields ZF at 256 k.1 bit). One of n data lines DL is connected to each cell field ZF. The data lines serve for writing information into the cell fields ZF and for reading the cell fields out. In a conventional manner, the $n=4$ data lines DL are connected through a first data switch DW1 to the data input terminal $D_i$. In order to write information into the memory, information present at the data input terminal $D_i$ during normal operation is switched to one of the $n=4$ data lines DL by addressing the first data switch DW1 by means of a given address information namely, an addressing signal A. The addressing signal is connected to the most significant ($A_x$) of existing address terminals, from where it is written into the corresponding cell fields ZF. Correspondingly, the data lines DL are connected to the data output terminal $D_o$ through a second data switch DW2. The second data switch DW2 is addressed address-wise exactly like the first data switch DW1. The second data switch DW2 connects one of the n data lines DL to the data output terminal $D_o$. The parts of a semiconductor memory according to the invention described so far are already known by themselves. Such parts are applied, for instance, in semiconductor memories which permit the so-called "nibble mode" of operation.

Advantageously, the semiconductor memory according to the invention contains a third data switch DW3 parallel to the first data switch DW1, by means of which information present during a test operation at the data input terminal $D_i$ can be transferred simultaneously to all $n=4$ data lines DL. For instance, the third data switch DW3 can contain $n=4$ parallel-connected transistors, one side of the conduction paths thereof being jointly connected to the data input terminal $D_1$ and the other side of the conduction paths thereof each being connected to a data line DL. The gates of the transistors of the third data switch DW3 are addressed by a control signal P, the generation of which will be described below. If information is written through the third data switch DW3 into the cell fields ZF, all of the cell fields ZF contain the same information.

Figure 3:
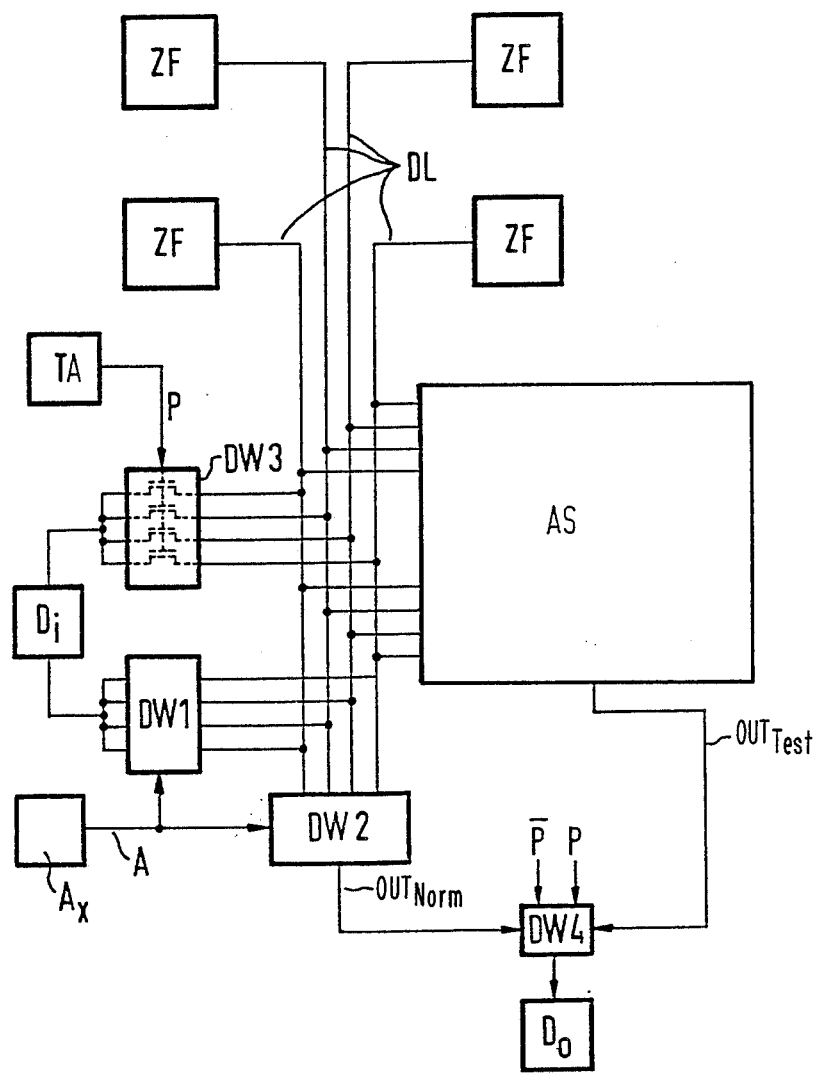
FIG. 3 is a circuit diagram of a second embodiment of the invention.

If each of the cell fields ZF is considered as a separate memory (test piece) during test operation, the "test" information which must be matched address-wise to a cell field ZF, can be written into all of the cell fields ZF in parallel at the same time. The control signal P which activates the third data switch DW3, can be obtained in different ways. In one embodiment according to FIG. 3, a test signal in the form of a constant potential (for instance, logical "1") is applied to a further terminal portion TA in the test case. In normal operation, either a constant potential, such as with the value "0" is applied, or the terminal TA remains unoccupied. The control signal P which is generated in this manner and which can be taken off directly at the terminal TA, then controls the gates of the transistors of the third data switch DW3 among other things so that the transistors are connected through. On one hand, this structure has the advantage of permitting the selection of a potential value which is otherwise also used for addressing the semiconductor memory (for instance, "TTL level"). On the other hand, however, an additional terminal is needed for the terminal TA which may not be available in some circumstances due to the dimensions of the housing of the semiconductor memory.

In another embodiment shown in FIG. 1, a terminal which is otherwise used for normal operation, is used concurrently. The most suitable terminal which is available is one which serves for addressing the semiconductor memory with address information, especially for the most significant X or Y or X/Y information (with the address multiplex method customary today). In normal operation a (most significant) address signal A with a "0" level of 0 volts and a "1" level of 5 volts is applied to such a terminal in semiconductor memories which are customary today. In the embodiment of the semiconductor memory according to the invention as illustrated in FIG. 1, this terminal is generally designated with reference symbol $A_x$. In the normal case, the most significant X/Y address information is connected to the terminal $A_x$. For instance, during test operation, a potential is applied which is distinctly above the "1" level of the customary signal connected to the address terminal $A_x$, such as 10V. A discriminator circuit DS connected thereto recognizes this applied potential and generates the control signal P internal to the semiconductor memory. Discriminator circuits DS are known in the art, such as in the form of threshold switches. Threshold switches can be found, for instance, in German Published, Non-Prosecuted Applications DE-OS No. 30 30 852 and DE-OS No. 33 18 564, the former corresponding to U.S. Pat. No. 4,458,338. However, other embodiments according to the state of the art are also conceivable.

A semiconductor memory according to the invention also contains m identical evaluation circuits AS (m=width of the data interfaces for data input and output).

It is the purpose of each of the evaluation circuits AS to take over the information present on the n data lines DL assigned to the respective evaluation circuit AS when reading out from the semiconductor memory and to pass it on if all of this information is equal (which corresponds to the "o.k. case" due to the previously accomplished parallel storage into the cell fields ZF). The information is passed on through an output OUT-$_{Test}$ to the data output terminal $D_o$. If the data are not equal, the evaluation circuits AS bring the output OUT$_{Test}$ into a high-resistance state. In this way the output terminal D$_o$ also assumes a high-resistance state which is then recognized as an error by an automatic tester connected to the data output terminal D$_o$.

If a logical "1" is expected at the data output terminal D$_o$ as the read-out information during the testing of the semiconductor memory on the basis of a test pattern applied thereto, the following three cases are possible:

(a) All cell fields ZF work correctly: each of the n=4 data lines DL receives a logical "1" from a memory cell of its assigned cell fields ZF just being addressed, which is passed on by the evaluation circuit AS to the data output terminal D$_o$ and which is recognized by the automatic tester as "o.k.":

(b) All cell fields ZF are defective at the memory cells being addressed (extremely improbable to be caused by individual defects and generally means almost a total failure of the semiconductor memory): only logical "0" signals are read out over the data lines DL, which the automatic tester recognized as a defect while they are not recognized as defects by the evaluation circuit AS and are therefore passed on as a logical "0" to the data output terminal D$_o$.

(c) From 1 to n−1 cell field(s) ZF contain(s) a defective addressed memory cell: the evaluation circuit AS recognizes this, places its output signal OUT$_{Test}$ into the high-resistance state and therefore also places the data output terminal D$_o$ into the high-resistance state. The automatic tester detects the fault.

If, on the other hand, a logical "0" is expected at the data output terminal D$_o$, the cycle is logically exactly as stated above when the logical "1" is the expected information.

Figure 2:
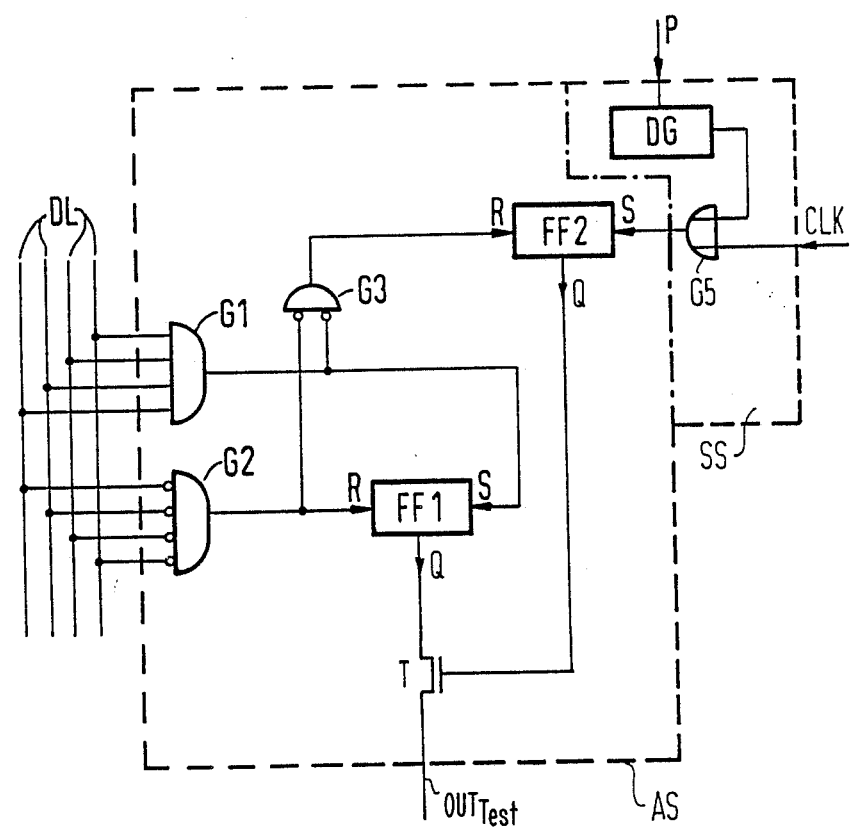

A possible advantageous embodiment of the evaluation or selection circuit AS is shown in FIG. 2 and will be explained below.

A first AND gate G1 has n=4 inputs. Each of the inputs is connected to one of the n=4 data lines DL. A second AND gate G2 is connected parallel to the inputs to the first AND gate G1. However, the n=4 inputs which are also provided for the second AND gate are negated (i.e. "inverted") so that the second AND gate G2 performs a NOR function. The first AND gate G1 switches at its output to a logical "1" only if all data lines DL are at logical "1". The same applies for the output of the second AND gate G2 (the output is a logical "1" only if all data lines DL are at logical "0").

The evaluation circuit AS furthermore contains a first multivibrator circuit FF1, which may be in the form of an RS flip-flop with a setting input S, a resetting input R as well as an output Q. The setting input S is connected to the output of the first AND gate G1 and sets the output of the first multivibrator circuit FF1 to a logical "1", if a logical "1" is applied to all of the inputs of the first AND gate G1. Analogously, the resetting input R is connected to the output of the second AND gate G2. The output is therefore set if a logical "1" is present at all n=4 data lines DL and is reset if a logical "0" is correspondingly present at all of the data lines DL. In the case of a defect, none of these conditions prevails; the first multivibrator circuit FF1 does not change its output.

The outputs of the two AND gates G1, G2 are connected in negated form to a third AND gate G3, parallel to the connection of the two inputs of the first multivibrator circuit FF1. The latter therefore acts likewise with a NOR function. The output of the third AND gate G3 is at logical "1" only if a defect is present, i.e. if not all n=4 data lines DL are at the same logical level ("0" or "1"). In the case of this defect, the output of the third AND gate resets a resetting input R of a second multivibrator circuit FF2 which can be of the same construction as the first multivibrator circuit FF1. The second multivibrator circuit FF2 also has a setting input S which is controlled by a setting circuit SS. The second multivibrator circuit FF2 has an output Q which is set by the setting input S to logical "1" and by the resetting input R to logical "0". Since the resetting input R is always activated in the event of a fault, it is also possible to make the following statement: the output of the second multivibrator circuit FF2 is reset in the event of a defect = to logical "0"; otherwise it is set to logical "1".

The output of the first multivibrator circuit FF1 is connected to the source terminal of a transistor T. The output of the second multivibrator circuit FF2 is connected to the gate of the transistor T. The output signal OUT$_{Test}$ of the evaluation circuit AS is generated at the drain of the transistor T. Assuming as an example that the transistor is of the n-channel enhancement type, it is always switched into conduction if the output of the second multivibrator circuit FF2 is set (=logical "1"). Then, the signal present at the output of the first multivibrator FF1 is passed on as the output signal OUT$_{Test}$ of the evaluation circuit AS to the data output terminal D$_o$. If the output of the second multivibrator circuit FF2 is reset (=logical "0"), due to the detected defect already described, the transistor T is cut off and the output signal OUT$_{Test}$ of the evaluation circuit AS assumes its high-resistance state. Since the output of the setting circuit SS forms the setting input S of the second multivibrator circuit FF2, the setting circuit should therefore make it possible to switch the transistor T into conduction if no defect is detected by the evaluation circuit AS.

This can be accomplished by applying a machine clock frequency CLK which is already available in the semiconductor memory to the setting input S of the second multivibrator circuit FF2, immediately at the start of every clock period TP. In practice, the setting circuit SS is therefore reduced to supplying a machine clock frequency CLK. It is, of course, also possible to supply the machine clock frequency CLK of the setting circuit SS externally, such as through a module terminal from the automatic tester connected thereto.

However, it is also possible to supply a machine clock frequency CLK only at the end of the clock period TP, i.e., after the evaluation in the automatic tester has taken place, so to speak, in preparation for the next clock period TP (see FIG. 7). However, it is then necessary to set the second multivibrator circuit FF2 immediately after the control signal P is activated and optionally immediately after the application of a supply voltage to the semiconductor memory. As is shown in FIG. 2, this can be achieved by feeding the control signal P through a customary differentiation stage DG to an input of an OR gate G5, the other input of which is connected to the machine clock frequency CLK. The output of the OR gate G5, which is also the output of the setting circuit SS, then acts as the setting input S of the second multivibrator circuit FF2 and sets its output Q at every clock cycle TP.

As already described, if a defect is detected by the evaluation circuit AS, the output of the second multivibrator circuit FF2 is reset through the resetting input R of the multivibrator circuit (=logical "0"), so that the transistor T is cut off. In this way, the output signal $OUT_{Test}$ assumes a higher resistance and consequently, the data output terminal $D_o$ also assumes a high-resistance state.

Figure 8:
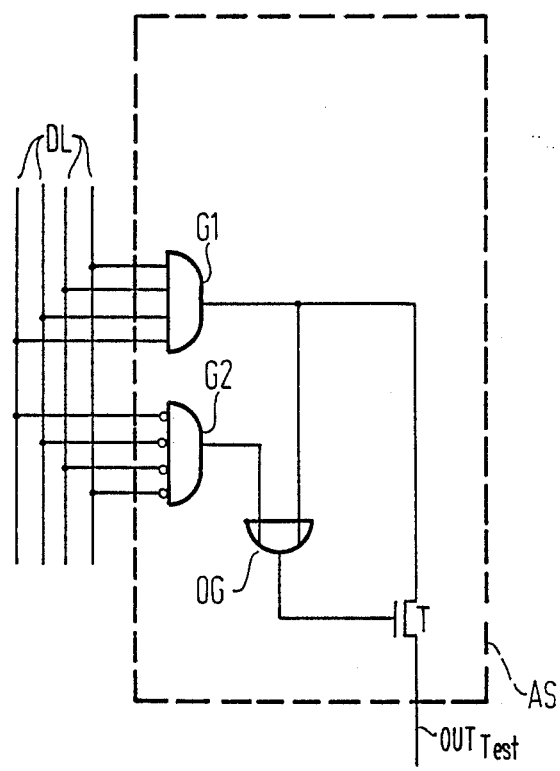

FIG. 8 shows another advantageous embodiment of the evaluation circuit AS. As compared to the embodiment according to FIG. 2, the FIG. 8 device represents substantial simplifications of the circuitry. Besides the two AND gates G1 and G2 and the transistor T already known from the embodiment according to FIG. 2, the FIG. 8 circuit contains only an OR gate OG. The source of the transistor T is connected directly to the output of the first AND gate G1. The output signal $OUT_{Test}$ is again generated at the drain of the transistor T. The gate of the transistor T is wired to the output of the OR gate OG. Each input of the OR gate OG is connected to an output of one of the two AND gates G1, G2.

The operation of this advantageous embodiment of the evaluation Circuit AS is very simple:

(Case 1): A logical "1" is present at all n data lines DL: The output of the first AND gate G1 is at a logical "1" as is the output of the OR gate OG. The transistor T is therefore switched into conduction and the signal $OUT_{Test}$ assumes the value logical "1".

(Case 2): A logical "0" is present at all data lines DL; The output of the first AND gate G1 is at logical "0", but the output of the second AND gate G2 is at logical "1". The output of the OR gate OG is therefore also at logical "1";

(Case 3): At 1 to n-1 of the data lines DL, a logical value other than that which is present at the remaining n data lines DL is present: The outputs of both AND gates G1, G2 are at logical "0". Consequently, the output of the OR gate is also logical "0", i.e., the transistor T is cut off. However, in this case the output signal $OUT_{Test}$ assumes its high-resistance state as intended.

Figure 4:
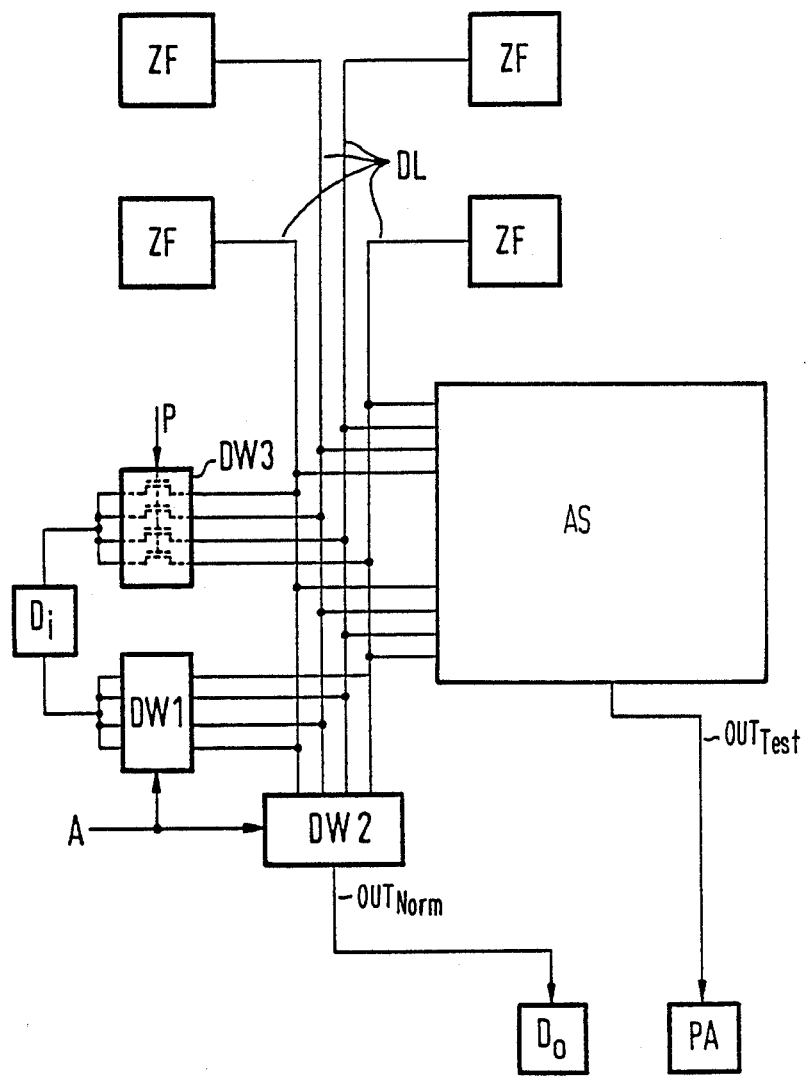
FIG. 4 is a circuit diagram of a third embodiment of the invention.

Advantageously, the embodiment of the invention according to FIG. 1 also includes a fourth data switch DW4 per bit of width m of the data interfaces, which, in normal operation serves for switching information $OUT_{Norm}$ leaving the respective second data switch DW2 to the respective data output terminal $D_o$ and which, during test operation serves for connecting the output signal $OUT_{Test}$ of the respective evaluation circuit AS to the respective data output terminal $D_o$ instead. This junction is provided by two transistors for each fourth data switch DW4. The source terminals of the transistors are connected together to the corresponding data output terminal $D_o$. The drain terminal of one transistor is connected to the output of the second data switch DW2, while the drain terminal of the other transistor is connected to the output of the evaluation circuit AS. The gate of one transistor is addressed by a signal $\overline{P}$ which is complementary to the control signal P, while the gate of the other transistor is addressed by the control signal P. It is therefore possible to selectively switch the output of the second data switch DW2 or that of the evaluation circuit AS to the data output terminal $D_o$. However, in another embodiment shown in FIG. 4, it is entirely possible to switch the output of each of the second data switches DW2 directly to the corresponding data output terminal $D_o$ and to similarly connect the output of each evaluation circuit AS directly and separately to a terminal PA of its own in the sense of a test terminal.

Figure 5:
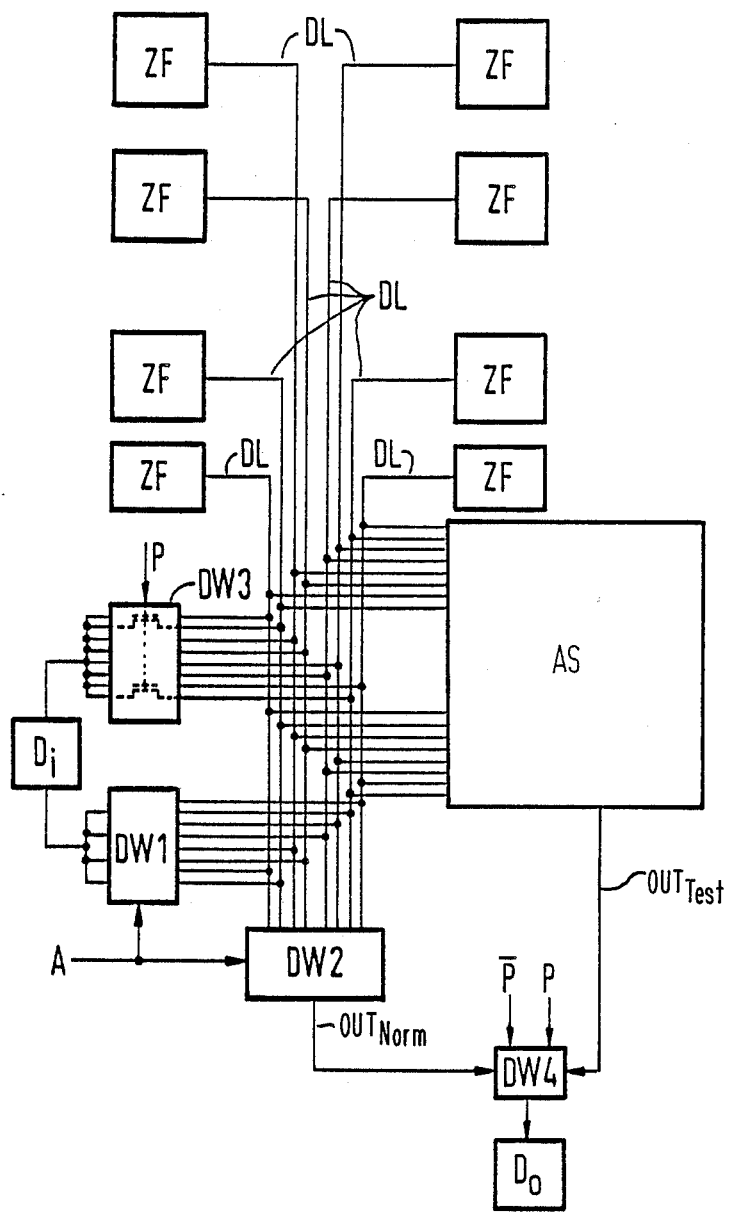
FIG. 5 is a circuit diagram of the first embodiment of the invention applied to a memory with eight cell fields.

FIG. 5 shows an embodiment of the semiconductor memory according to the invention, in which n=8 cell fields ZF are used instead of n=4 cell fields ZF. The operation of the semiconductor memory is the same as described for FIG. 1. In test operation, an even greater reduction of the testing time is obtained.

Figure 6:
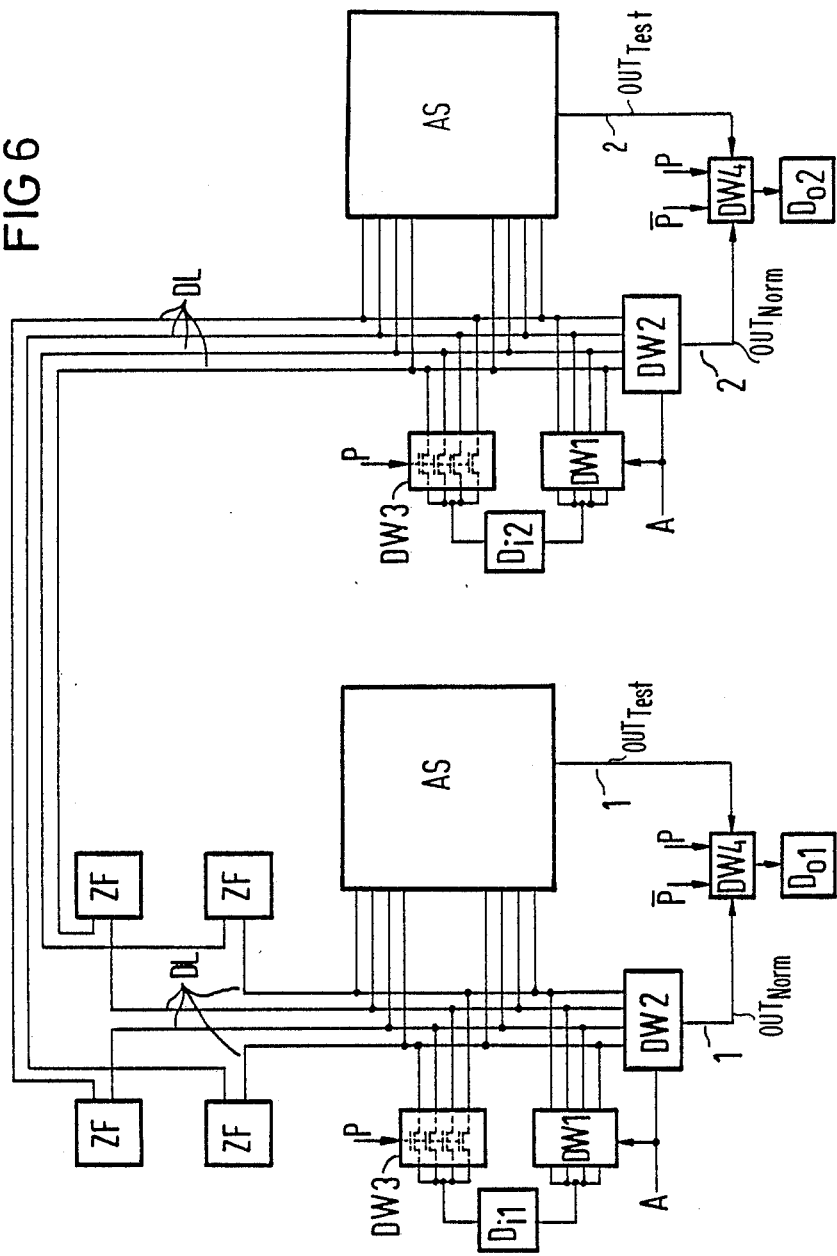
FIG. 6 is a circuit diagram of the first embodiment of the invention, applied to a memory with data interfaces in a width of 2 bits.

FIG. 6 shows an embodiment of the semiconductor memory according to the invention, in which n=4 cell fields ZF are used again, but which has a width of m=2 bits at the data interfaces. The operation is the same as described in FIG. 1. It must merely be clarified that both respective first data switches DW1, second data switches DW2, third data switches DW3, fourth data switches DW4, the cell fields ZF as well as the two evaluation circuits AS each operate in parallel with and independently of, each other. In order to illustrate the fact that the data interfaces of the m=2 bits carry information independently of each other, the designations $D_{i1}$, $D_{o1}$, $D_{i2}$, $D_{o2}$, $OUT_{Test1}$, $OUT_{Test2}$, $OUT_{Norm1}$, $OUT_{Norm2}$, were chosen instead of the designations $D_i$, $D_o$, $OUT_{Test}$ and $OUT_{Norm}$.

Further embodiments of the invention are possible, especially regarding the construction of the evaluation circuit AS. However, they all are within the scope of the invention since it is not a problem for one of ordinary skill in the art to modify the logic circuits disclosed herein without deviating from the object on which the invention is based, or the basic idea of the invention.

I claim:

1. Integrated semiconductor memory, comprising n identical memory cell fields each having a data width of m bits, wherein n and m represent positive integers, n data lines each having m bit lines, each data line being connected to a respective one of said memory cell fields for writing memory data into and reading memory data out of said memory cell fields, m data input terminals each receiving one bit of the memory data to be written into said semiconductor memory during writing, m first data switches each receiving one bit of the addressing data and being connected between said data lines and said data input terminals for applying the memory data bits to a respective one of said n data lines as a function of the addressing data, m second data switches each receiving one bit of the addressig data and being connected to said data lines for each selecting a respective one of said n data lines when reading out the memory data applied to said n data lines as a function of the addressing data and feeding the memory data from a selected data line to outputs thereof, m evaluation circuits, each connected to n of said n data lines in parallel to said second data switches, said evaluation circuit having a low resistance output signal containing the m memory data bits read out from said memory cell fields if none of the memory data bits are defective and having a high-resistance state if at least one of said memory data bits is defective, a control terminal for providing a control signal having a "0" or a complementary "1" state, m third data switches each connected between one of said m data input terminals and a respective bit line in each of said n data lines, parallel to said first data switches, being responsive to the state of said control signal for transferring the memory data in parallel to all of said n data lines as a function of the state of said control signal, m data output terminals, and m fourth data switches being responsive to the complementary state of the control signal and being connected between said outputs of said second data switches and said evaluation circuits and said data output terminals, for selectively feeding said memory data selected by said second data switch and the state of the output signal from said evaluation circuit to said data output terminal, said data output terminal having a high-resistance state when the output signal from said evaluation circuit has a high-resistance state.

2. Integrated semiconductor memory according to claim 1, wherein said evaluation circuit includes a first multivibrator circuit with a first input being activated if all if said n data lines connected to said evaluation circuit are in a first logical state, a second input being activated if all of said n data lines connected to said evaluation circuit have a second logical state complementary to said first logical state and an output being intentionally selectively set and reset if all of said n data lines have the same logical state, a setting circuit having an output, a second multivibrator circuit having an output, a first input resetting said output of said second multivibrator circuit if all of said n data lines connected to said evaluation circuit do not have the same logical state and a second input connected to said output of said setting circuit for setting said output of said second multivibrator circuit.

3. Integrated semiconductor memory according to claim 2, wherein said evaluation circuit includes a differentiation stage connected between said setting circuit and said terminal for activating said setting circuit when the first control signal is activated, when a supply voltage is applied through said differentiation stage and when a machine clock frequency is applied to said setting circuit 4. Integrated semiconductor memory according to claim 2, wherein said second input of said second multivibrator circuit sets said output thereof at the start of clock periods.

5. Integrated semiconductor circuit according to claim 2, wherein said evaluation circuit includes a transistor having a source connected to said output of said first multivibrator circuit, a drain delivering the output signal of said evaluation circuit, and a gate connected to said output of said second multivibrator circuit.

6. Integrated semiconductor memory according to claim 1, wherein each of said third data switches includes n transistors each having a conduction path connected between a corresponding one of said data input terminals and a respective one of said n data lines connected to said data input terminal, and gates connected in parallel to said terminal for receiving the first control signal.

7. Integrated semiconductor memory according to claim 1, wherein each of said m fourth data switches includes first and second transistors having source terminals connected together to said data output terminal connected to said fourth data switch, said first transistor having a drain terminal connected to said output of a corresponding one of said second data switches and a gate terminal connected to said first-mentioned terminal for receiving the second control signal, and said second transistor having a drain terminal connected to said output of said evaluation circuit and a gate terminal connected to said first-mentioned terminal for receiving said first control signal.

8. Integrated semiconductor memory according to claim 1, wherein said terminal includes a separate terminal portion of the semiconductor memory used for the first control signal.

9. Integrated semiconductor memory according to claim 1, wherein said terminal for the control signals is also used for other signals from the semiconductor memory.

10. Integrated semiconductor memory according to claim 9, wherein the addressing data includes a most significant addressing signal being fed to said terminal for the control signals during normal operation.

11. Integrated semiconductor memory according to claim 9, wherein a higher potential than that corresponding to a logical "1" is applied for switching from normal to test operation in which said evaluation circuit is used.

12. Integrated semiconductor memory according to claim 11, including a discriminator circuit connected to said terminal for the control signals, for recognizing if a higher potential is applied.

13. Integrated semiconductor memory, comprising n identical memory cell fields, n.m data lines each being connected to a respective one of said memory cell fields for writing memory data into and reading memory data out of said memory cell fields, m data input terminals receiving the memory data to be written into the semiconductor memory during writing, m first data switches receiving addressing data and being connected between said data lines and said data input terminals for applying the memory data to a respective one of said n data lines as a function of the addressing data, m second data switches receiving the addressing data and being connected to said data lines for each selecting a respective one of said n data lines when reading out the memory data applied to said n data lines as a function of the addressing data and feeding the memory data from a selected data line to outputs thereof, m data output terminals connected to said outputs of said second data switches, an evaluation circuit connected to n of said n.m data lines in parallel to said second data switches, said evaluation circuit having an output issuing an output signal containing the memory data read out from said memory cell fields if none of the memory data are defective and having a high-resistance state if between 1 and n-1 memory data are defective, another separate otherwise unused terminal connected to said output of said evaluation circuit, a terminal for providing a control signal, and m third data switches connected between each of said m data input terminals and said n of n.m data lines parallel to said first data switches, for receiving the control signal from said terminal and transferring the memory data in parallel to all of said n data lines as a function of the control signal.

14. Integrated semiconductor memory according to claim 1, wherein said evaluation circuit includes a first AND gate with n inputs and one output, a second AND gate with n inverted inputs and one output, an OR gate having two inputs each being connected to a respective one of said outputs of said AND gates and having an output, and a transistor having a source terminal connected to said output of said first AND gate, a gate terminal connected to said output of said OR gate, and a drain terminal delivering said output signal of said evaluation circuit.

* * * * *